(12) United States Patent
Kim et al.

(10) Patent No.: US 8,604,876 B2
(45) Date of Patent: Dec. 10, 2013

(54) CURRENT BUFFER

(75) Inventors: Namsoo Kim, San Diego, CA (US); Joseph Patrick Burke, Glenview, IL (US)

(73) Assignee: QUALCOMM, Incorporated, San Diego, CA (US)

( * ) Notice: Subject to any disclaimer, the term of this patent is extended or adjusted under 35 U.S.C. 154(b) by 40 days.

(21) Appl. No.: 13/107,754

(22) Filed: May 13, 2011

(65) Prior Publication Data

US 2012/0286869 A1  Nov. 15, 2012

(51) Int. Cl.
*H03F 3/45* (2006.01)

(52) U.S. Cl.
USPC .......................................... 330/253; 330/258

(58) Field of Classification Search
USPC .......................................... 330/252, 253, 258
See application file for complete search history.

(56) References Cited

U.S. PATENT DOCUMENTS

| | | | |
|---|---|---|---|
| 5,748,040 A | 5/1998 | Leung | |
| 6,084,470 A | 7/2000 | Shiramatsu et al. | |
| 6,636,098 B1 * | 10/2003 | Kizer | 330/258 |
| 7,193,466 B2 * | 3/2007 | Kim et al. | 330/258 |
| 7,521,996 B2 * | 4/2009 | Kluge | 330/252 |
| 7,679,436 B2 * | 3/2010 | Jimenez et al. | 330/253 |
| 7,804,361 B2 * | 9/2010 | Lim et al. | 330/253 |
| 2004/0239369 A1 | 12/2004 | Hsu et al. | |

FOREIGN PATENT DOCUMENTS

WO    2008103757    8/2008

OTHER PUBLICATIONS

International Search Report and Written Opinion—PCT/US2012/037134—ISA/EPO—Sep. 10, 2012.

* cited by examiner

*Primary Examiner* — Khanh V Nguyen
(74) *Attorney, Agent, or Firm* — William M. Hooks

(57) ABSTRACT

A current filtering current buffer amplifier includes: a first port and a second input port configured to be coupled to and receive input current; a first output port and a second output port configured to be coupled to and provide current to a load; a buffer configured to transfer the received input current to the first and second output ports as an output current, the buffer having an input impedance and an output impedance where the output impedance is higher than the input impedance, the buffer including first and second amplifiers, the first amplifier being a common mode feedback amplifier; and a filter coupled to the first and second input ports and coupled to the first and second amplifiers, the filter having a complex impedance and being configured to notch filter the received input current.

15 Claims, 6 Drawing Sheets

CURRENT BUFFER

BACKGROUND

A buffer amplifier (a.k.a. buffer) is an electronic device that provides electrical impedance transformation from one circuit to another. Two main types of buffers exist: the voltage buffer and the current buffer. Typically a current buffer amplifier is used to transfer a current from a first circuit, having a low output impedance level, to a second circuit with a high input impedance level. The interposed buffer amplifier inhibits the second circuit from loading the first circuit unacceptably and interfering with its desired operation.

In the ideal current buffer the input resistance is zero while the output resistance is infinite (impedance of an ideal current source is infinite). Other properties of the ideal buffer typically include perfect linearity regardless of signal amplitudes and instant output response regardless of the speed of the input signal. For a current buffer amplifier, if the current is transferred unchanged (the current gain is 1), the amplifier is called a unity gain buffer or a current follower because the output current "follows" or tracks the input current. The current gain of a current buffer amplifier is (approximately) unity. Existing current buffer amplifiers, while providing current buffering, do not provide current filtering. Also, existing current buffer amplifiers ordinarily do not provide near-perfect linearity at output.

FIG. 1 illustrates a conventional current buffer amplifier 100 that comprises unipolar transistors 102, 104, 112, 114, 116, and 118 (e.g., FET common gate connected transistors), differential amplifiers 106 and 110, a phase shift amplifier 108, and resistors 120 and 122. The differential amplifiers 106 and 110 are common mode feedback (CMFB) amplifiers used to suppress common-mode signals. The drains of the transistors 112 and 114 are connected to the inputs of the amplifiers 106 and 108 as shown in FIG. 1. The two input ports of the buffer amplifier are connected to the drains of the transistors 112 and 114 respectively. The positive input port is connected to a negative input port of the amplifier 108, the source of the transistor 102, and a negative input port of the amplifier 106. The negative input port is connected to a positive input port of the amplifier 108, the source of the transistor 106, and a positive input port of the amplifier 106. The input current $i_{in}$ is an output current from a first circuit (not shown) which is transferred to the second circuit (not shown) as output current $i_{out}$ by the current buffer amplifier 100. When both $i_{in}+$ and $i_{in}-$ are applied, the CMFB amplifier 106 will amplify the $i_{in}$ input signal and the FET transistors 102, 104, 112, 114 will invert the signal (180° phase) and substrate the common signal. For differential signal CMFB would not operate. In this case, the input current I in will pass through. Thus, the input impedance $g_{m1}$ is kept low and the output impedance $g_{m2}$ is kept high.

Ideally, a current buffer amplifier is perfectly linear, with the output signal strength varying in direct proportion to the input signal strength. In a linear device, the output-to-input signal amplitude ratio is always the same, no matter what the strength of the input signal. A graph 200 in FIG. 2 illustrates an ideal current transfer gain as a function of frequency.

In reality, however, the type of ideal linearity illustrated in FIG. 2 is difficult to accomplish. Even if an amplifier exhibits linearity under normal conditions, it will become nonlinear if the input signal is too strong due to overdrive. The amplification curve bends toward a horizontal slope as the input-signal amplitude increases beyond a critical point, producing distortion in the output. In analog applications such as amplitude-modulation (AM), wireless transmission and hi-fi audio, linearity is important. Nonlinearity in these applications results in signal distortion because the fluctuation in gain affects the shape of an analog output waveform with respect to the analog input waveform. Accordingly, a linearity issue may arise in the current buffer amplifier illustrated in FIG. 1 when current is converted to voltage at the output.

SUMMARY

An example of a current filtering current buffer amplifier comprises: a first port and a second input port configured to be coupled to and receive input current; a first output port and a second output port configured to be coupled to and provide current to a load; a buffer configured to transfer the received input current to the first and second output ports as an output current, the buffer having an input impedance and an output impedance where the output impedance is higher than the input impedance, the buffer comprising first and second amplifiers, the first amplifier being a common mode feedback amplifier; and a filter coupled to the first and second input ports and coupled to the first and second amplifiers, the filter having a complex impedance and being configured to notch filter the received input current.

Implementations of such an amplifier may comprise one or more of the following features. The filter includes an RC circuit having a resistance and a capacitance, the filter being coupled to positive and negative inputs of both of the first and second amplifiers. The resistance comprises first and second resistances, the first resistance coupled between the first input port and negative inputs of the first and second amplifiers, and the second resistance being coupled between the second input port and positive inputs of the first and second amplifiers. The capacitance is connected between the first and second resistances. The capacitance includes a first capacitance coupled between the positive inputs of the first and second amplifiers and ground, and a second capacitance coupled between the negative inputs of the first and second amplifiers and the ground. The amplifier further comprises a booster coupled to the buffer and configured to boost a common gate voltage of a transistor of the buffer to inhibit transfer gain in a pass band of the amplifier and in a stop band of the amplifier. The booster portion includes a first booster circuit coupled to the first input port via a third capacitance and a second booster circuit coupled to the second input port via a fourth capacitance, the third and fourth capacitances being configured to pass current of frequencies in the stop band of the amplifier to the first and second booster circuits, respectively.

An example of a method of buffering current between first and second circuits includes: providing an input impedance to an output of the first circuit and an output impedance to an input of the second circuit, the output impedance being higher than the input impedance; and transferring current received from the first circuit to the second circuit by low-pass and notch filtering the current received from the first circuit such that: first current received from the first circuit having a frequency below a first frequency is transferred to the second circuit such that a first output amplitude is at least half of a first input amplitude of the first current; and second current received from the first circuit having a frequency above a second frequency is transferred to the second circuit such that a second output amplitude is less than one-tenth of a second input amplitude of the second current; where the second frequency is less than about two times the first frequency.

Implementations of such a method may comprise one or more of the following features. The notch filtering causes a local minimum of transfer gain to occur at a local-minimum frequency that is between about 1.3 times the first frequency and about 1.7 times the first frequency. The method further comprises inhibiting transfer gain at least one of below the first frequency or above the local-minimum frequency.

An example of a current buffer comprises: a first port and a second input port configured to be coupled to and receive input current; a first output port and a second output port configured to be coupled to and provide current to a load; a buffer portion configured to transfer the received input current to the first and second output ports as an output current, the buffer portion having an input impedance and an output impedance where the output impedance is higher than the input impedance; and filter means, coupled to the first and second input ports, the first and second output ports, and the buffer portion, for filtering the received input current such that the amplifier has transfer gains, for the received input current from the first and second input ports to the first and second output ports, above a first transfer gain value for frequencies up to a first frequency, has transfer gains below a second transfer gain value for frequencies above a second frequency that is higher than the first frequency, has a transfer gain of a third transfer gain value at a third frequency that is higher than the second frequency, and has a transfer gain of a fourth transfer gain value at a fourth frequency that is higher than the third frequency, the third transfer gain value being lower than the second transfer gain value and the fourth transfer gain value being higher than the third transfer gain value.

Implementations of such a buffer may comprise one or more of the following features. The filter means are configured such that the first transfer gain value is about −3 dB, the second transfer gain value is about −10 dB, and the second frequency is about 1.2 times the first frequency. The third frequency is about 1.5 times the second frequency. The filter means comprise an RC circuit, including resistance and capacitance, coupled between the first and second input ports and the first and second output ports. Values of the resistance and capacitance determine the third frequency.

Items and/or techniques described herein may provide one or more of the following capabilities. A current filtering current buffer amplifier may provide tunable notch filtering, reduced pass band peaking, and improved linearity compared to a conventional current buffer amplifier. A current buffer amplifier can be provided that is inexpensive and easy to tune, has a broad range and that will enhance diversity and a range of acceptable input and output circuits. Amplifiers are provided for use in electronic devices that employ circuits with low input impedance and high output impedance, for example, mobile electronic devices including portable computers, mobile telephones, personal digital assistants, and the like.

DETAILED DESCRIPTION

The described features generally relate to one or more improved methods and/or apparatus for current buffering. Further applicability of the described methods and apparatus will become apparent from the following detailed description, claims, and drawings. The detailed description and specific examples are given by way of illustration only, since various changes and modifications within the spirit and scope of the description will become apparent to those skilled in the art. Thus, the following description provides examples, and is not limiting of the scope, applicability, or configuration set forth in the claims. Changes may be made in the function and arrangement of elements discussed without departing from the spirit and scope of the disclosure. Various examples may omit, substitute, or add various procedures or components as appropriate. For instance, the methods described may be performed in an order different from that described, and various operations may be added, omitted, or combined. Also, features described with respect to certain examples may be combined with other examples.

Figure 1:
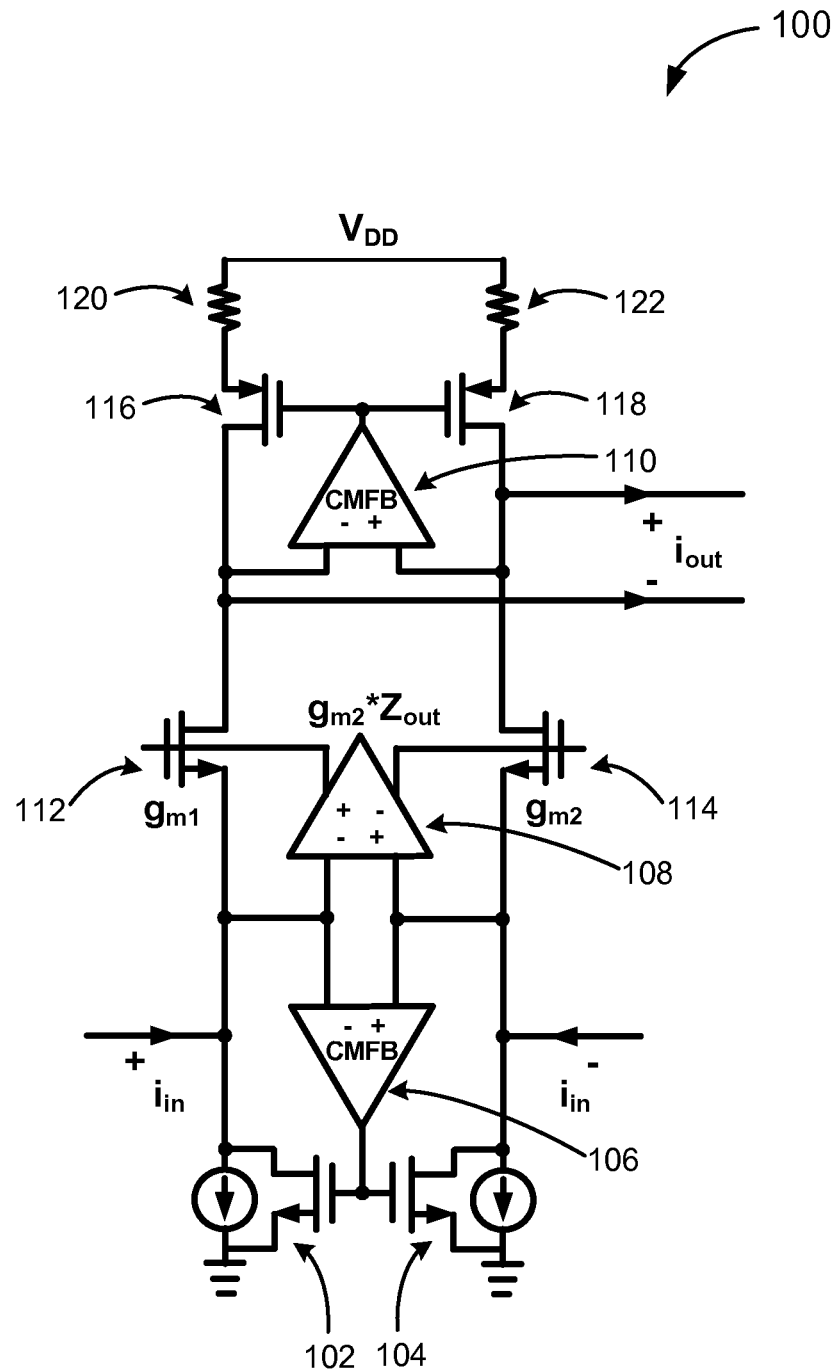
FIG. 1 is a circuit diagram of a conventional current buffer amplifier.
Figure 2:
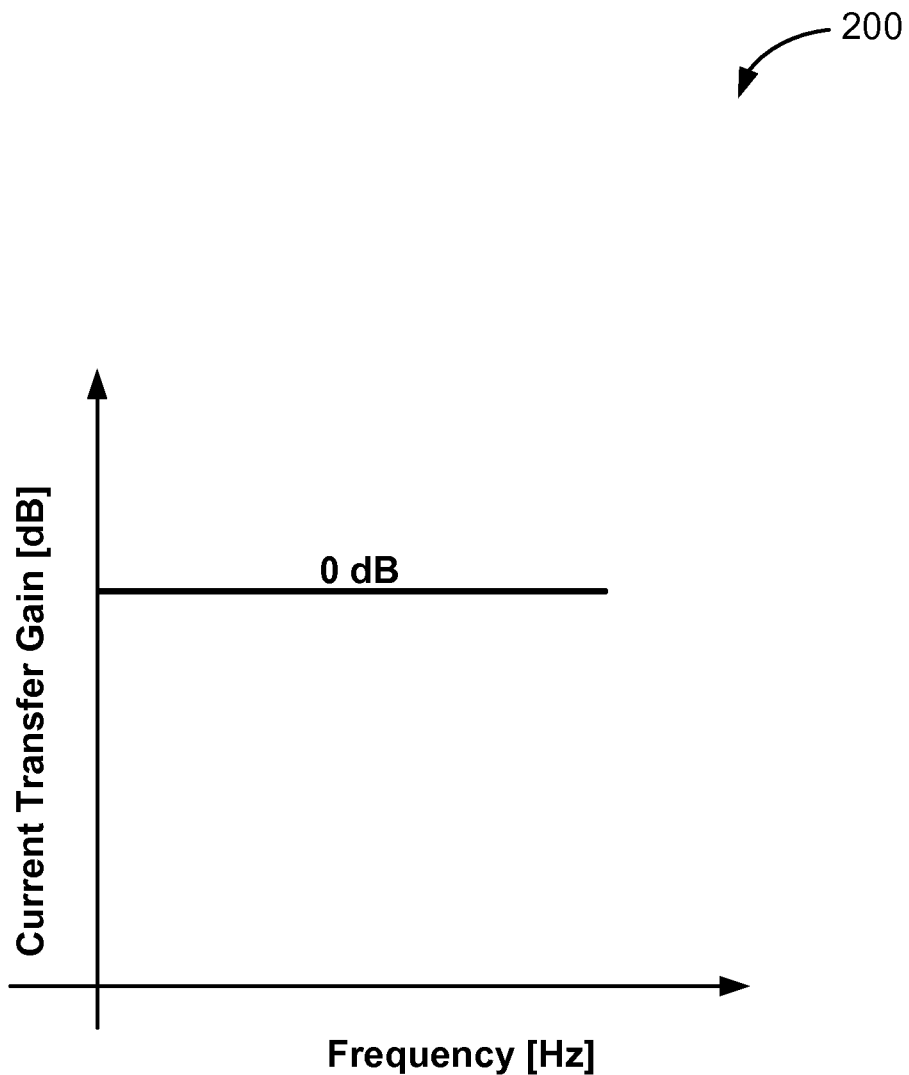
FIG. 2 is a graph illustrating an ideal current transfer gain as a function of frequency.
Figure 3:
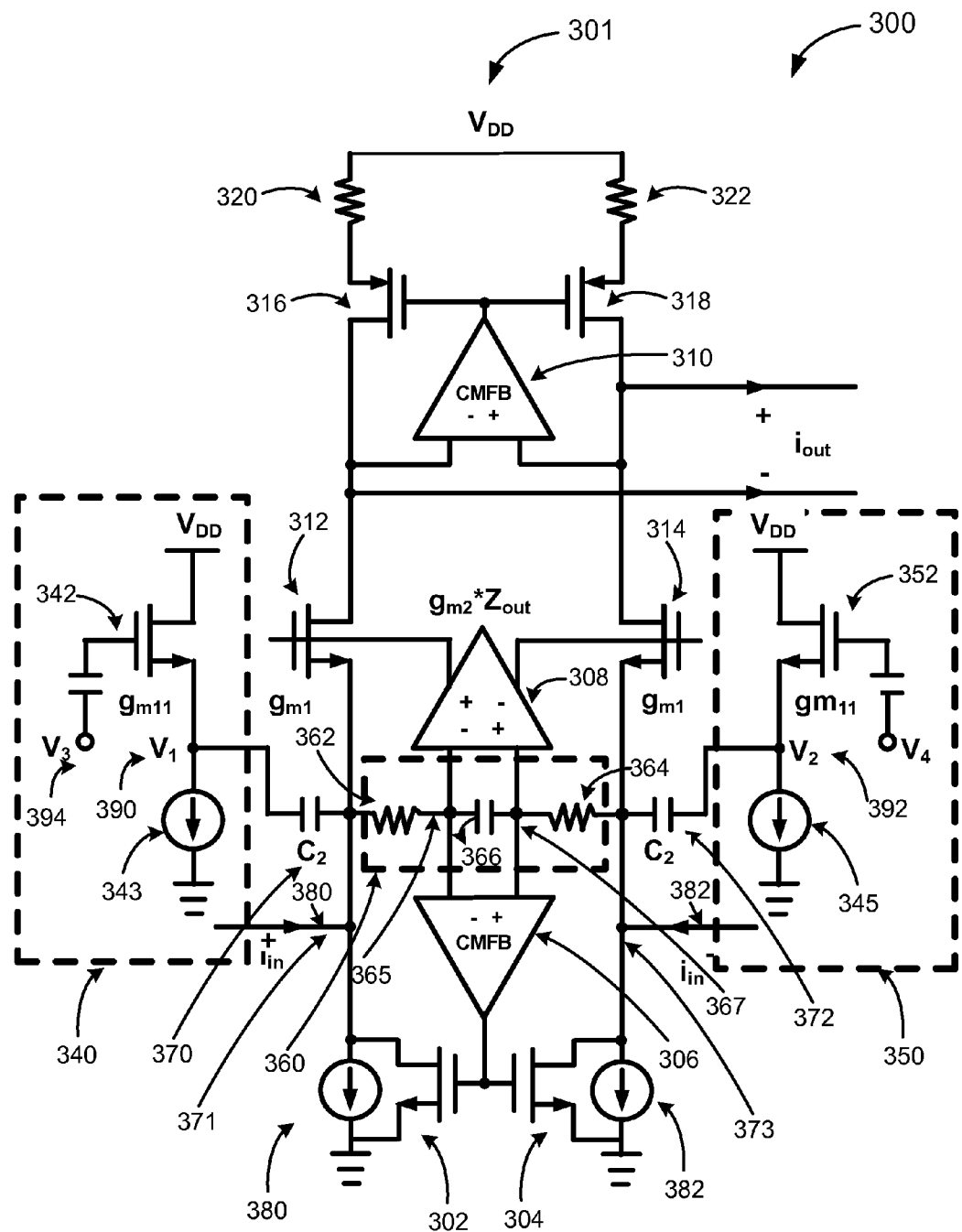
FIG. 3 is a circuit diagram of a current filtering current buffer amplifier.

FIG. 3 illustrates an example circuit diagram of a current filtering current buffer amplifier 300 configured to provide tunable notch filtering and reduced band-pass peaking. The amplifier 300 will pass signals having frequencies within a certain range with little or no attenuation, and possibly with gain, and reject (i.e., significantly attenuate) signals having frequencies outside that range. The amplifier 300 includes a buffer portion 301 similar to, but different from, the current buffer 100 illustrated in FIG. 1. The buffer portion 301 includes transistors 302, 304, 312, 314, 316, 318, resistances 320 and 322, and amplifiers 306, 308, 310. In addition, the buffer amplifier 300 includes common gate boost circuits 340, 350 that include unipolar transistors 342, 352 and are configured to boost common gate voltage for transistors 302, 304 respectively. The common gate boost circuits 340, 350 provide low impedance at high frequency by absorbing high-frequency signals, which helps prevent (inhibits) input impedance from becoming too high and helps reduce pass-band peaking (i.e., a maximum gain in the pass band).

In the illustrative amplifier 300 shown in FIG. 3, the boost circuit 340 is common-gate connected at a node $V_1$ and the boost circuit 350 is common-gate connected at a node $V_2$. The node $V_1$ of the boost circuit 340 is connected between the drain of the transistor 342 and a current source 343 that is connected to ground. Similarly, the node $V_2$ in the boost circuit 350 is connected between the drain of the transistor 352 and a current source 345 that is connected to ground. The boost circuits 340, 350 are respectively connected via capacitors 370, 372 to a positive input node 371 and a negative input node 373 of the buffer portion 301. The input nodes 371, 373 are connected to drains of the transistors 312, 314, gates of the transistors 302, 304, and current sources 380, 382 that are connected to ground. A positive input current line 380 is connected to the input node 371 and carries an input current $i_{in}^+$. A negative input current line 382 is connected to the input node 373 and carries an input current $i_{in}^-$.

The buffer portion 301 includes an RC circuit 360 connected between the positive and negative input nodes 371, 373. The RC circuit 360 includes two resistors 362, 364 each of resistance $R_1$ and a capacitor 366 of capacitance $C_1$. The RC circuit 360, as shown, has the resistor 362 connected in series with the capacitor 366 connected in series with the resistor 364, all connected in series between the nodes 371, 373. A node 365 connected to both the resistor 362 and the capacitor 366 is also connected to negative input ports of the amplifiers 306, 308. A node 367 connected to the resistor 364 and the capacitor 366 is also connected to positive input ports of the amplifiers 306, 308. Thus, the input node 371 is connected via the resistor 362 to the capacitor 366 and the negative input port of each of the amplifiers 306, 308, and the input node 373 is similarly connected via the resistor 364 to the capacitor 366 and the positive input port of each of the amplifiers 306, 308. The capacitor 366 is connected between the positive and negative input ports of each of the amplifiers 306, 308. While the RC circuit 360 is shown in FIG. 3 as having the resistor 362 in series with the capacitor 366 in series with the resistor 364 between the nodes 371, 373, alternative physical configurations are possible. For example, the node 371 can be connected via the resistor 362 to a capacitor that is connected to ground and the node 373 can be connected via the resistor 364 to another physically separate capacitor to ground. From an electrical standpoint, however, this is equivalent to the RC circuit 360 shown in FIG. 3.

Figure 4:
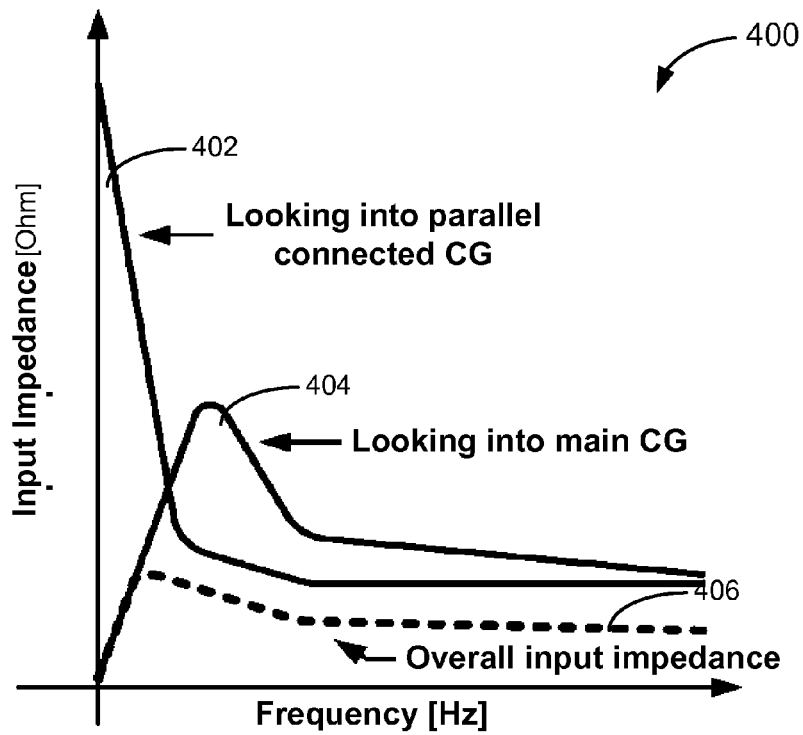
FIG. 4 is a graph of an input impedance as a function of frequency for the current filtering current buffer amplifier illustrated in FIG. 3.
Figure 5:
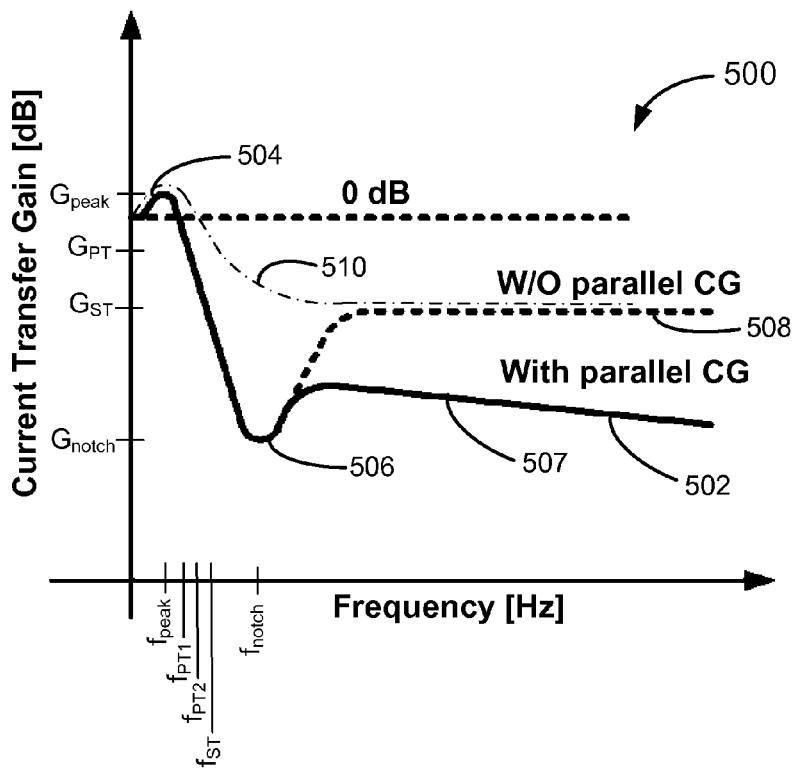
FIG. 5 is a current transfer gain as a function of frequency for the current filtering current buffer amplifier illustrated in FIG. 3.

The RC circuit 360 serves to provide current notch filtering of the input signal as illustrated in FIGS. 4-5 and described below. The notch filtering may be tuned by changing the capacitance value $C_1$ of the capacitor 366. Capacitances $C_2$ of the capacitors 370, 372 that connect the boost circuits 340 and 350 to the input nodes 371 and 372 of the buffer portion 301 of the circuit 300 are used to block low frequencies by changing the frequency of the common mode signal input in the nodes 365 and 367. Without the boost circuits, 3430, 350, high-frequency signals would encounter a high impedance from the transistors 312, 314, and be reflected back into the buffer 301. The boost circuits 340, 350, however, provide low impedances at high frequencies, thus helping the amplifier 300 to pass low-frequency current to the output and inhibiting high-frequency current from reaching the output.

Figure 6:
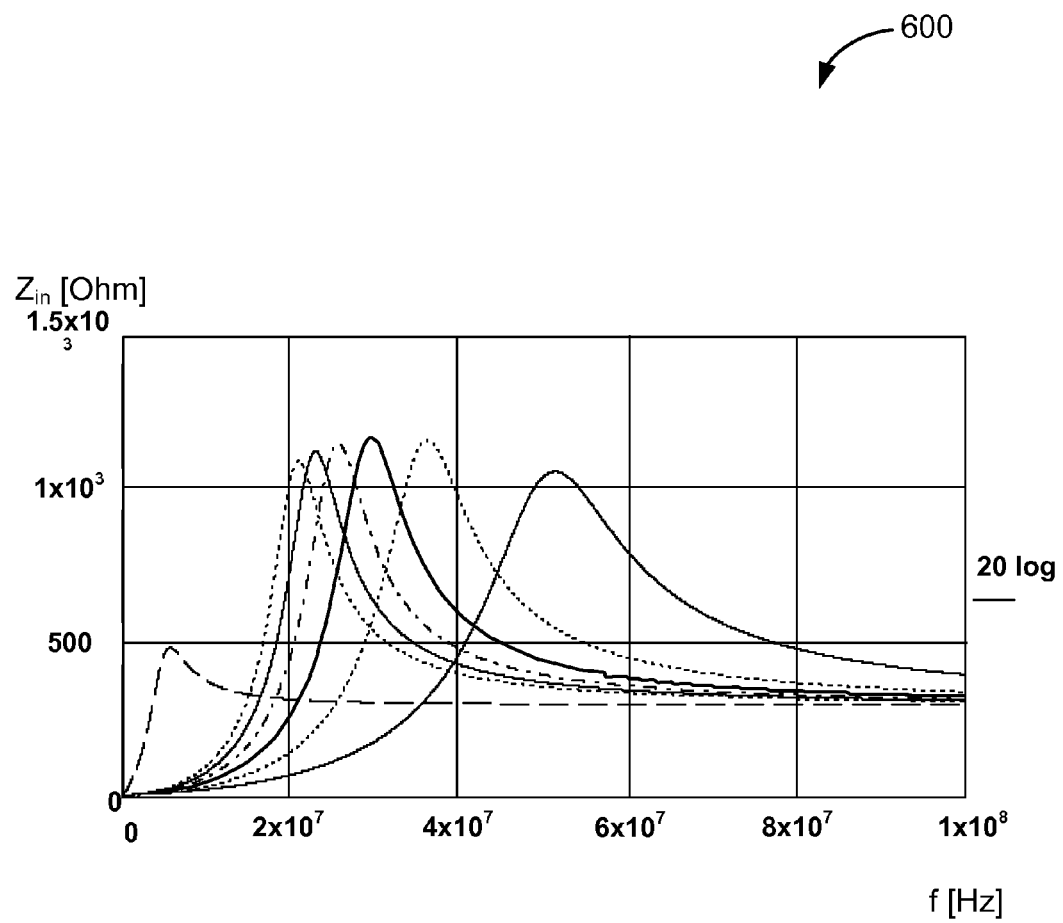
FIG. 6 is a graph of a total input impedance of a main common gate as a function of frequency with various resistance and capacitance values for the current filtering current buffer amplifier illustrated in FIG. 3.

In operation, the current filtering current buffer amplifier 300 provides current buffering between two circuits with current filtering, where the filtering comprises passing low frequencies and notch filtering high frequencies as illustrated in FIGS. 4-6.

Referring also to FIGS. 4 and 5, a graph 400 shows an input impedance as a function of frequency and a graph 500 shows a current transfer gain as a function of frequency for the current buffer amplifier 300. A plot 402 illustrates the impedance as a function of frequency looking into nodes $V_1$, $V_2$ indicated by arrows 390 and 392 in FIG. 3. A plot 404 illustrates the impedance ($g_{m11}$) as a function of frequency looking into a node $V_3$ indicated by arrow 394 in FIG. 3. A plot 406 illustrates the combined input impedance. As shown in FIG. 4, the impedance 404 i.e., $g_{m1}$, peaks at a low frequency and subsides at a higher frequency. A plot 502 of the graph 500 illustrating the current transfer gain as a function of frequency shows that at low frequency $f_{peak}$, there is a local/relative gain peak 504 of a peak gain $G_{peak}$. In a pass band from 0 Hz to a pass-threshold frequency $f_{PT1}$, gain is above the dotted line (0 DB) and thus positive, indicating that signals are passed and some transfer gain is provided. Alternatively, the pass band may extend to a higher pass-threshold frequency $f_{PT2}$ corresponding to a pass-threshold gain $G_{PT}$ (e.g., -3 dB) with acceptably low attenuation of signals to be considered as passing these signals. At higher frequencies, signals are filtered and attenuated, reaching a stop-threshold gain $G_{ST}$ of approximately -10 dB, although other levels may be acceptable and are determined by the circuit characteristics of the circuit values used at a stop-threshold frequency $f_{ST}$, which is a tunable value, and reaching a local/relative minimum gain $G_{notch}$ at a corresponding frequency $f_{notch}$ at a "notch" 506 of the curve 502. With the notch filtering provided by the RC circuit 360, the gain of the amplifier 300 reaches the stop-threshold gain $G_{ST}$ at a lower frequency than without the RC circuit 360 as shown by a gain curve 510 of gain provided by the amplifier 300 without the RC circuit 360. Further, as indicated by a portion 507 of the plot 502 labeled "with parallel CG" and a plot 508 labeled "W/O parallel CG," the gain with the parallel common gate boost circuits 340, 350 connected to the buffer portion 301 is lower at frequencies above the notch frequency than without the circuits 340, 350 connected.

The frequency $f_{notch}$ at the relative/local minimum gain $G_{notch}$ will be approximately equal to the center frequency of the notch filter characteristics. The frequency $f_{notch}$ corresponding to the local-minimum gain may be the center frequency of the notch filter characteristics or may be shifted to a slightly higher frequency due to the gain roll-off provided by the low-pass filter characteristics. The amount of difference between the center frequency of the notch filter characteristics and the local minimum-gain frequency $f_{notch}$ will depend upon the gain characteristics (e.g., rate of gain roll-off) at and near the center frequency of the notch filter characteristics. The frequency $f_{notch}$ corresponds to a local minimum gain as gain at frequencies above (at least above and near/adjacent) the notch frequency $f_{notch}$ are higher than the local minimum gain $G_{notch}$.

FIG. 6 illustrates a graph 600 showing total input impedance $Z_{in}$ of the main common gate as a function of frequency with various $R_1$ and $C_1$ values. $Z_{in}$ may be calculated as follows:

$$Z_{in} = \frac{(1 + s \cdot C_{out} \cdot R_{out}) \cdot (1 + s \cdot C_1 \cdot R_1)}{s^2 \cdot C_1 \cdot C_{out} \cdot R_{out} \cdot (1 + g_{m1} \cdot R_1) + s \cdot [C_1 \cdot (1 + g_{m1} \cdot R_1) + g_{m1} \cdot C_{out} \cdot R_{out}] + g_{m1} \cdot (1 + g_{m2} \cdot R_{out})}$$

$$f_p \approx \frac{1}{2\pi} \cdot \sqrt{\frac{g_{m2}}{C_1 \cdot R_1 \cdot C_{out} \cdot R_{out}}}$$

$$Q \approx 2\pi \cdot \sqrt{g_{m2} \cdot C_1 \cdot R_1 \cdot C_{out} \cdot R_{out}} \cdot \frac{R_{out}}{C_1 \cdot R_1 + C_{out} \cdot R_{out}}$$

Where s=jw,
$C_{out}$ is the output capacitance of the feedback amplifier 308,
$R_{out}$ is the output resistance of the feedback amplifier 308.
$g_{m2}$ is the transconductance of the feedback amplifier 308,
$f_p$ is the peak frequency of the curves shown in the graph 600.
The different plots shown in the graph 600 correspond to different experimental values of $R_1$ and $C_1$.

Figure 7:
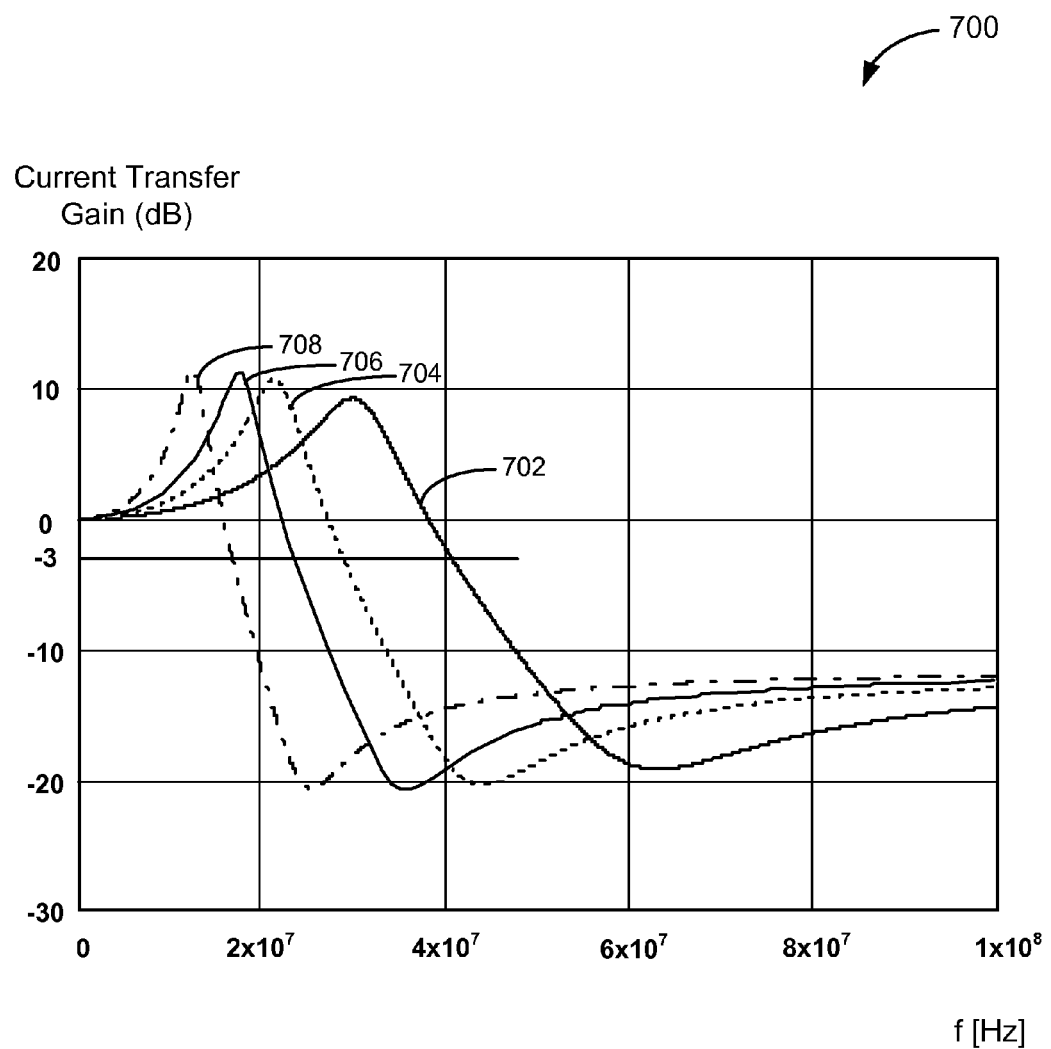
FIG. 7 is a graph of an input-to-output transfer function of the current filtering current buffer amplifier illustrated in FIG. 3.

A graph 700 in FIG. 7 illustrates an input-to-output transfer function 700 of the current buffer amplifier 300. The graph 700 shows the magnitude of current transfer gain of the buffer amplifier 300 in dB values as a function of frequency. As shown in FIG. 7, the peaking gets reduced, i.e. peaks illustrated in FIG. 7 go down, with the boost circuits 340, 350 being used. The transfer value $H_{CFCB}(f)$ shown in FIG. 7 may be calculated as follows:

$$H_{CFCB}(f) = \frac{-g_{m1} \cdot (\alpha(f) - 1)}{\frac{sC_1}{1 + sC_1 R_1} - (\alpha(f) - 1) \cdot (sC_{gs1} + g_{m1})}$$

-continued $$\alpha(f) = \frac{sC_{gs1} - \frac{g_{m2}}{1+sC_1R_1}}{sC_{gs1} + \frac{1+sC_{out}R_{out}}{R_{out}}}$$

where $C_{gs1}$ is the parasitic capacitance between gate and source of the transistors 312, 314. The different curves shown in FIG. 7 correspond to different experimental values of Referring to FIGS. 3, 5, and 7, the amplifier 300, and in particular the buffer 301, is configured to provide desired characteristics of the peak 504 and the notch 506 and desired relationships of the peak 504 to the notch 506. The peak gain $G_{peak}$, peak-gain frequency $f_{peak}$, notch gain $G_{notch}$, and notch-gain frequency $f_{notch}$ may have various values depending on the design of the amplifier. For example, referring to FIG. 7, the peak gain $G_{peak}$ is about 10 dB (here from about 9 dB to about 12 dB), the peak-gain frequency $f_{peak}$ may be between about 12 MHz and about 30 MHz (here from about 10 MHz to about 32 MHz), the notch gain $G_{notch}$ may be about −20 dB (her from about −18 dB to about −21 dB), and the notch-gain frequency $f_{notch}$ may be between about 25 MHz and about 60 MHz (here from about 23 MHz to about 63 MHz). A ratio of the notch-gain frequency $f_{notch}$ to the peak-gain frequency $f_{peak}$ is about 2 to 1 (here from about 1.9 to 1 to about 2.1 to 1). A ratio of the notch-gain frequency $f_{notch}$ to the 3 dB pass-threshold frequency $f_{PT2}$ is preferably between about 1.3 to 1 and about 1.7 to 1, here about 1.5 to 1 (from about 1.4 to 1 to about 1.6 to 1). A ratio of the notch-gain frequency $f_{notch}$ to the 0 dB pass-threshold frequency $f_{PT1}$ is about 1.65 to 1 (here from about 1.55 to one to about 1.75 to 1). A ratio of the stop-threshold frequency $f_{ST}$ (with the stop-threshold gain $G_{ST}$ being −10 dB) to the −3 dB pass-threshold frequency $f_{PT2}$ is preferably less than about 2 to 1, here about 1.2 to 1 (here from about 1.15 to 1 to about 1.25 to 1).

The previous description is provided to enable a person skilled in the art to make or use the disclosure. Various modifications to the disclosure will be readily apparent to those skilled in the art, and the generic principles defined herein may be applied to other variations without departing from the spirit or scope of the disclosure. The disclosure is not limited to the examples and designs described herein but is accorded the widest scope consistent with the principles and features disclosed herein.

The invention claimed is:

1. A current filtering current buffer amplifier comprising:
a first input port and a second input port configured to be coupled to and receive input current, wherein the first input port receives a positive current input and the second input port receives a negative current input;
a first output port and a second output port configured to be coupled to and provide current to a load, wherein the first output port outputs a positive current and the second output port outputs a negative current;
a buffer configured to transfer the received input current to the first and second output ports as an output current, the buffer having an input impedance and an output impedance where the output impedance is higher than the input impedance, the buffer including first and second amplifiers, the first amplifier being a common mode feedback amplifier; and
a filter coupled to the first and second input ports and coupled to the first and second amplifiers, the filter having a complex impedance and being configured to notch filter the received input current.

2. The amplifier of claim 1 wherein the filter includes an RC circuit having a resistance and a capacitance, the filter being coupled to positive and negative inputs of both of the first and second amplifiers.

3. The amplifier of claim 2 wherein the resistance comprises first and second resistances, the first resistance coupled between the first input port and negative inputs of the first and second amplifiers, and the second resistance being coupled between the second input port and positive inputs of the first and second amplifiers.

4. The amplifier of claim 3 wherein the capacitance is connected between the first and second resistances.

5. The amplifier of claim 4 wherein the capacitance comprises a first capacitance coupled between the positive inputs of the first and second amplifiers and ground, and a second capacitance coupled between the negative inputs of the first and second amplifiers and the ground.

6. The amplifier of claim 1 further comprising a booster coupled to the buffer and configured to boost a common gate voltage of a transistor of the buffer to inhibit transfer gain in a pass band of the amplifier and in a stop band of the amplifier.

7. The amplifier of claim 6 wherein the booster portion comprises a first booster circuit coupled to the first input port via a third capacitance and a second booster circuit coupled to the second input port via a fourth capacitance, the third and fourth capacitances being configured to pass current of frequencies in the stop band of the amplifier to the first and second booster circuits, respectively.

8. A method of buffering current between first and second circuits, the method comprising:
providing an input impedance to an output of the first circuit and an output impedance to an input of the second circuit, the output impedance being higher than the input impedance; and
transferring current received from the first circuit to the second circuit by low-pass and notch filtering the current received from the first circuit such that:
first current received from the first circuit having a frequency below a first frequency is transferred to the second circuit such that a first output amplitude is at least half of a first input amplitude of the first current; and
second current received from the first circuit having a frequency above a second frequency is transferred to the second circuit such that a second output amplitude is less than one-tenth of a second input amplitude of the second current;
wherein the second frequency is less than about two times the first frequency.

9. The method of claim 8 wherein the notch filtering causes a local minimum of transfer gain to occur at a local-minimum frequency that is between about 1.3 times the first frequency and about 1.7 times the first frequency.

10. The method of claim 9 further comprising inhibiting transfer gain at least one of below the first frequency or above the local-minimum frequency.

11. A current buffer comprising:
a first input port and a second input port configured to be coupled to and receive input current, wherein the first input port receives a positive current input and the second input port receives a negative current;
a first output port and a second output port configured to be coupled to and provide current to a load, wherein the first output port outputs a positive current and the second output port outputs a negative current;
a buffer portion configured to transfer the received input current to the first and second output ports as an output current, the buffer portion having an input impedance and an output impedance where the output impedance is higher than the input impedance; and filter means, coupled to the first and second input ports, the first and second output ports, and the buffer portion, for filtering the received input current such that a gain amplifier has transfer gains, for the received input current from the first and second input ports to the first and second output ports, above a first transfer gain value for frequencies up to a first frequency, has transfer gains below a second transfer gain value for frequencies above a second frequency that is higher than the first frequency, has a transfer gain of a third transfer gain value at a third frequency that is higher than the second frequency, and has a transfer gain of a fourth transfer gain value at a fourth frequency that is higher than the third frequency, the third transfer gain value being lower than the second transfer gain value and the fourth transfer gain value being higher than the third transfer gain value.

12. The buffer of claim 11 wherein the filter means are configured such that the first transfer gain value is about −3 dB, the second transfer gain value is about −10 dB, and the second frequency is about 1.2 times the first frequency.

13. The buffer of claim 11 wherein the third frequency is about 1.5 times the second frequency.

14. The buffer of claim 11 wherein the filter means comprise an RC circuit, including resistance and capacitance, coupled between the first and second input ports and the first and second output ports.

15. The buffer of claim 14 wherein values of the resistance and capacitance determine the third frequency.

\* \* \* \* \*